United States Patent
Brandenburg et al.

(10) Patent No.: US 7,364,684 B2
(45) Date of Patent: Apr. 29, 2008

(54) METHOD OF MAKING AN ENCAPSULATED MICROELECTRONIC PACKAGE HAVING FLUID CARRYING ENCAPSULANT CHANNELS

(75) Inventors: Scott D. Brandenburg, Kokomo, IN (US); Suresh K. Chengalva, Kokomo, IN (US); Thomas A. Degenkolb, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 102 days.

(21) Appl. No.: 10/919,156

(22) Filed: Aug. 16, 2004

(65) Prior Publication Data

US 2006/0033236 A1  Feb. 16, 2006

(51) Int. Cl.
B29C 45/14 (2006.01)
B28B 7/30 (2006.01)

(52) U.S. Cl. .......................... 264/272.13; 264/272.11; 264/272.17; 264/272.21; 264/271.1; 264/275; 264/272.15; 264/272.14; 264/279; 264/313

(58) Field of Classification Search ............ None
See application file for complete search history.

(56) References Cited

U.S. PATENT DOCUMENTS

| | | | | |
|---|---|---|---|---|
| 4,279,944 A * | 7/1981 | Laskaris | ...................... | 427/62 |
| 4,567,006 A * | 1/1986 | Covington et al. | ......... | 264/459 |
| 4,774,630 A * | 9/1988 | Reisman et al. | ............ | 361/718 |
| 5,001,548 A * | 3/1991 | Iversen | ....................... | 257/714 |
| 5,241,450 A * | 8/1993 | Bernhardt et al. | .......... | 361/689 |
| 5,276,586 A | 1/1994 | Hatsuda et al. | ............. | 361/387 |
| 5,349,237 A | 9/1994 | Sayka et al. | ................. | 257/715 |
| 5,376,326 A * | 12/1994 | Medney et al. | ............. | 264/510 |
| 5,696,405 A | 12/1997 | Weld | .......................... | 257/714 |
| 5,708,297 A * | 1/1998 | Clayton | ...................... | 257/723 |
| 6,096,656 A * | 8/2000 | Matzke et al. | .............. | 438/702 |
| 6,600,651 B1 | 7/2003 | Weng | ......................... | 361/700 |
| 6,733,607 B2 * | 5/2004 | Smith et al. | ............. | 156/89.11 |
| 6,836,014 B2 * | 12/2004 | Hunt et al. | ................. | 257/706 |
| 6,910,874 B2 * | 6/2005 | Bolken et al. | .............. | 425/116 |
| 6,972,955 B2 * | 12/2005 | Pleskach et al. | ........... | 361/689 |
| 6,980,438 B2 * | 12/2005 | Huang et al. | ............... | 361/719 |
| 6,994,151 B2 * | 2/2006 | Zhou et al. | ................ | 165/80.4 |
| 7,000,684 B2 * | 2/2006 | Kenny et al. | .............. | 165/80.4 |
| 7,032,392 B2 * | 4/2006 | Koeneman et al. | ............ | 62/77 |
| 7,049,166 B2 * | 5/2006 | Salatino et al. | ............... | 438/64 |

* cited by examiner

*Primary Examiner*—Christina Johnson
*Assistant Examiner*—Jeff Wollschlager
(74) *Attorney, Agent, or Firm*—Jimmy L. Funke

(57) ABSTRACT

A method of making a fluid cooled microelectronic package in which fluid is circulated through the package in fluid-carrying channels defined at least in part by voids in an encapsulant that surrounds the package components. Preferably, the encapsulant channels are defined in part by heat producing components of the package so that coolant fluid directly contacts such components. The coolant fluid can be electrically conductive or non-conductive depending on the type of components being cooled. The coolant channels are formed by insert-molding a form in the encapsulant, and removing the form following the molding process. Alternately, the encapsulant is formed in two or more pieces that are joined to form the package, and the coolant channels are defined by recesses formed in at least one of the encapsulant pieces.

5 Claims, 2 Drawing Sheets

METHOD OF MAKING AN ENCAPSULATED MICROELECTRONIC PACKAGE HAVING FLUID CARRYING ENCAPSULANT CHANNELS

TECHNICAL FIELD

The present invention relates to fluid cooled microelectronic packages, and more particularly to a method of making an encapsulated microelectronic package in which the encapsulant is provided with fluid carrying channels for cooling microelectronic devices within the package.

BACKGROUND OF THE INVENTION

Various types of cooling mechanisms can be used to remove waste heat from high power semiconductor devices, with liquid cooling being used in cases where the waste heat and/or the ambient temperature are very high. In a typical liquid cooling application, the microelectronic devices are mounted on a heat exchanger or cold plate that has internal fluid conducting channels and inlet and outlet pipes for coupling it to a cooling system including a fluid reservoir, a pump and an external heat exchanger. Due to limited thermal conduction between the semiconductor devices and the cold plate, the cold plate must be relatively large and the pump must be capable of producing high fluid flow. As a result, such cooling systems tend to be too large, too heavy and too expensive for many applications. The thermal coupling between the semiconductor devices and the cooling system can be improved by integrating a cooling tube or heat pipe into the microelectronic package, as disclosed for example, in the U.S. Pat. Nos. 5,276,586; 5,349,237; 5,696,405; and 6,600,651. However, the packaging techniques disclosed in such patents are either overly expensive to implement or limited to use with a single semiconductor device. Accordingly, what is needed is a cost-effective way of liquid cooling high power microelectronic packages including any number of semiconductor devices.

SUMMARY OF THE INVENTION

The present invention is directed to a method of making a fluid cooled microelectronic package in which fluid is circulated through the package in fluid-carrying channels defined at least in part by voids in an encapsulant that surrounds the package components. Preferably, the encapsulant channels are defined in part by heat producing components of the package so that coolant fluid directly contacts such components. The coolant fluid can be electrically conductive or non-conductive depending on the type of components being cooled. According to a first embodiment, the coolant channels are formed by insert-molding a form in the encapsulant, where the form material has a thermal coefficient of expansion that is much higher than the remainder of the package, allowing the form to be removed following the molding process and after cooling of the package. According to a second embodiment, the encapsulant is molded in two or more pieces that are joined to form the package, and the coolant channels are defined by recesses formed in at least one of the encapsulant pieces.

BRIEF DESCRIPTION OF THE DRAWINGS

FIG. 1 depicts the package during the molding process, FIG. 2 is a cross-sectional view of the silicone rod of FIG. 1, and FIG. 3 depicts the package following removal of the silicone rod.

FIG. 4 depicts a partially encapsulated microelectronic package, FIG. 5 depicts a molded cover for the microelectronic package of FIG. 4, and FIG. 6 depicts the microelectronic package following joining of the partially encapsulated microelectronic package of FIG. 4 and the molded cover of FIG. 5.

DESCRIPTION OF THE PREFERRED EMBODIMENT

In general, the present invention is directed to a method of making a fluid cooled microelectronic package including heat producing microelectronic components and an encapsulant compound molded over the components, where the encapsulant is formed in a manner to define internal voids through which fluid coolant is brought into contact with the components. The method of this invention is disclosed herein in the context of a microelectronic package including semiconductor flip-chips mounted on a substrate such as a printed circuit board, but it should be understood that the method applies to microelectronic packages including other types of components and component packages.

Figure 1:
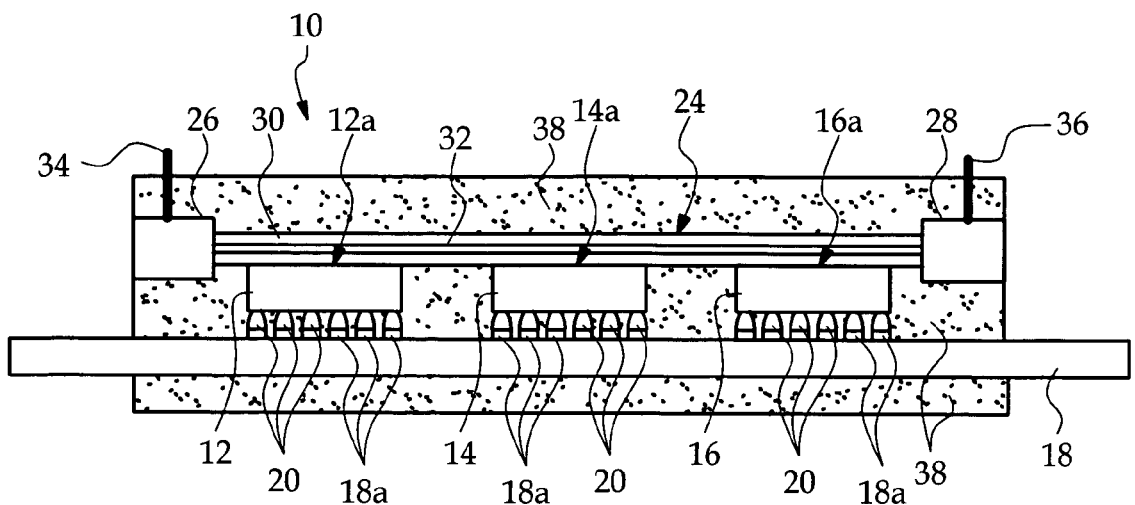
FIGS. 1-3 depict a method of making an encapsulated microelectronic package according to a first embodiment of this invention, where a re-usable silicone rod is insert-molded with an encapsulant compound and subsequently removed to form fluid carrying channels in the package.
Figure 2:
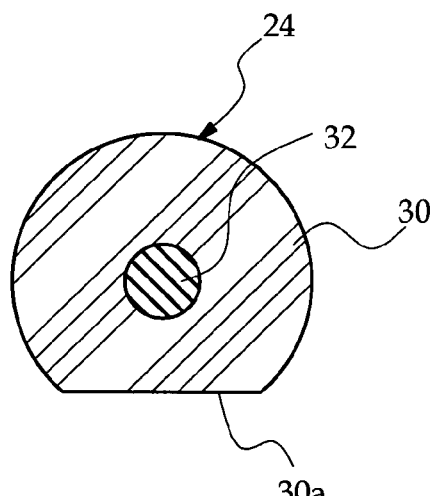
Figure 3:
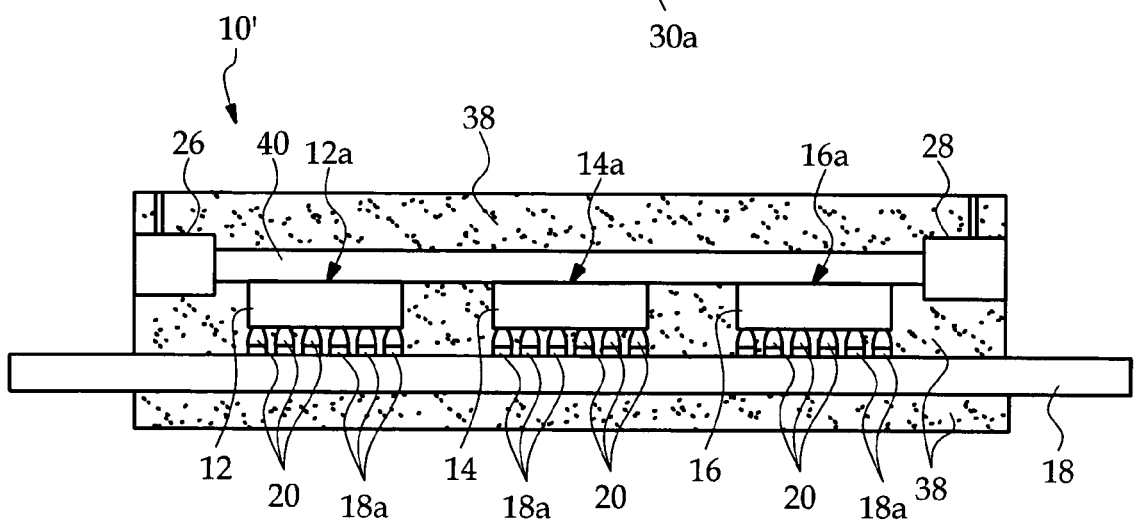

FIGS. 1-3 illustrate a method of manufacture according to a first embodiment of this invention, where encapsulant voids are formed during the encapsulant molding process by insert-molding a form that is subsequently removed. FIG. 1 depicts an encapsulated microelectronic package 10 including a number of lateral-geometry semiconductor chips 12, 14, 16 mounted on a substrate 18 such as a printed circuit board. In the illustrated embodiment, the semiconductor chips 12, 14, 16 are configured as flip-chips, with electrical connections between the chips 12, 14, 16 and the substrate bond sites 18a being defined by multiple re-flowed solder bumps 20. After the various components are soldered to the substrate 18, the assembly is fixtured in an over-molding apparatus (not shown), and a channel-forming assembly is fixtured into the over-molding apparatus as shown in FIG. 1. The channel-forming assembly includes a rod 24 terminated at one end by an inlet fitting 26 and at the other end by an outlet fitting 28. Referring to FIGS. 1-2, the rod 24 preferably comprises a rigid metal inner core 32 and an outer shell 30 of silicone or other material exhibiting a high coefficient of thermal expansion. The periphery of outer shell 30 is generally D-shaped in cross-section as shown in FIG. 2 and the channel-forming assembly is positioned within the over-molding apparatus so that the flat portion 30a of the outer shell periphery engages the top or exposed surfaces 12a, 14a, 16a the semiconductor chips 12, 14, 16 as shown in FIG. 1. The mold fixturing includes a set of metal pins 34, 36 that hold the channel-forming assembly in place, and the rigidity of the inner core 32 ensures that the silicone outer shell 30 remains pressed Into engagement with the semiconductor chips 12, 14, 16.

The over-molding apparatus is then heated, and a plastic encapsulant 38 such as a thermoset epoxy or a thermoplastic compound or other potting material is introduced into the over-molding apparatus. The encapsulant 38 fills the regions surrounding the chips 12, 14, 16, the channel-forming assembly and substrate 18 as shown in FIG. 1. After a prescribed amount of time, the mold pins 34, 36 are removed, and the encapsulated package 10 is taken out of the over-molding apparatus and cooled. During the cooling process, the outer shell 30 of rod 24 undergoes significant contraction due to its high coefficient of thermal expansion (≈150 ppm/° C.) relative to the other components. Preferably, the silicone of outer shell 30 includes a mold release agent such as polytetrafluoroethylene (PTFE) to ensure that it remains intact and pulls away from the chips 12, 14, 16 and surrounding encapsulant 38 as it contracts. When the package 10 and silicone outer shell 30 have fully cooled, the rod 24 is removed from the package 10, resulting in the completed microelectronic package 10' of FIG. 3. Referring to FIG. 3, the encapsulant 38 now has formed therein a coolant channel or void 40 having a cross-sectional profile generally corresponding to that of the expanded outer shell 30, and extending between inlet and outlet fittings 26, 28. The void 40 is bounded primarily by the surrounding encapsulant 38, but also by the surfaces 12a, 14a, 16a of the semiconductor chips. 12, 14, 16. As a result, fluid coolant supplied to the inlet fitting 26 comes into direct contact with the semiconductor chip surfaces 12a, 14a, 16a before being exhausted through the outlet fitting 28. With no intervening layers or materials between the coolant and the semiconductor chip surfaces 12a, 14a, 15a, the heat transfer to the coolant is significantly higher than could otherwise be achieved. In the illustrated embodiment where the coolant contacts only inactive surfaces of the microelectronic components 12, 14, 16, the coolant may be electrically conductive. In applications where the coolant contacts active surfaces of the microelectronic components (as in the case of vertical-geometry semiconductor chips), the coolant must be electrically non-conductive if electrical isolation between the components is required.

Figure 4:
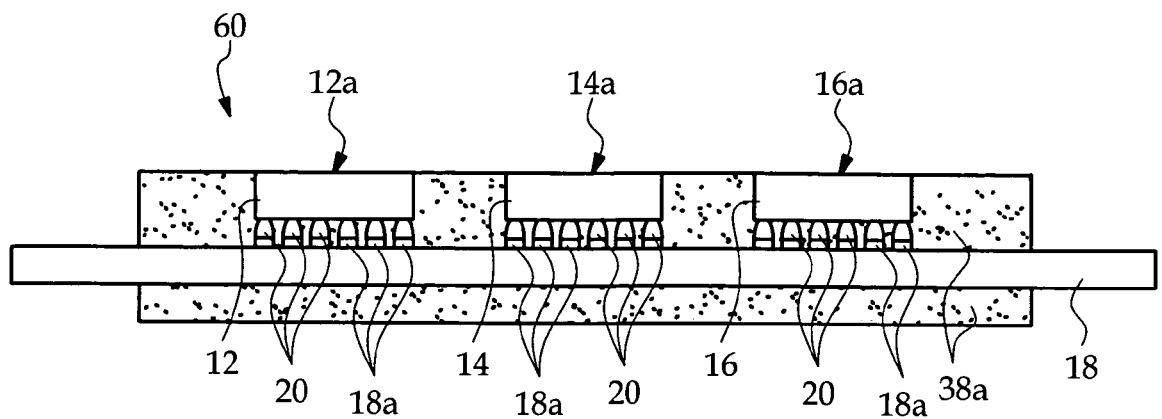
FIGS. 4-6 depict a method of making an encapsulated microelectronic package according to a second embodiment of this invention, where the encapsulant is molded in two pieces that are joined to form the package, and the coolant channels are defined by a recess in one of the encapsulant pieces.
Figure 5:
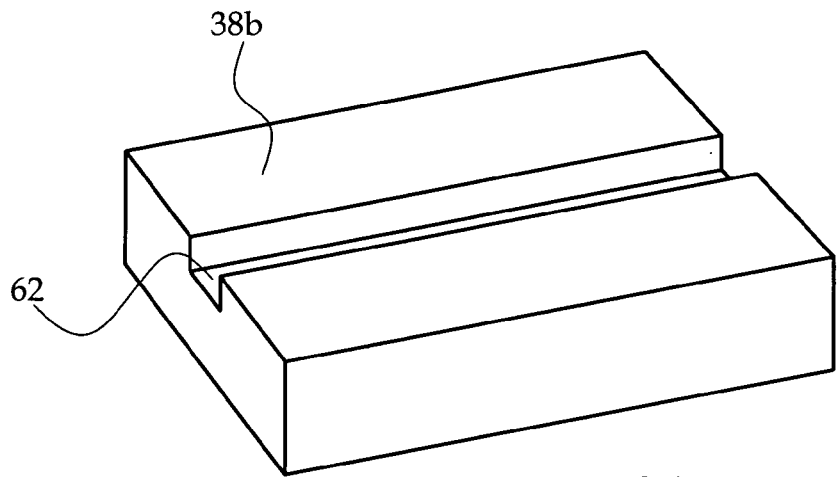
Figure 6:
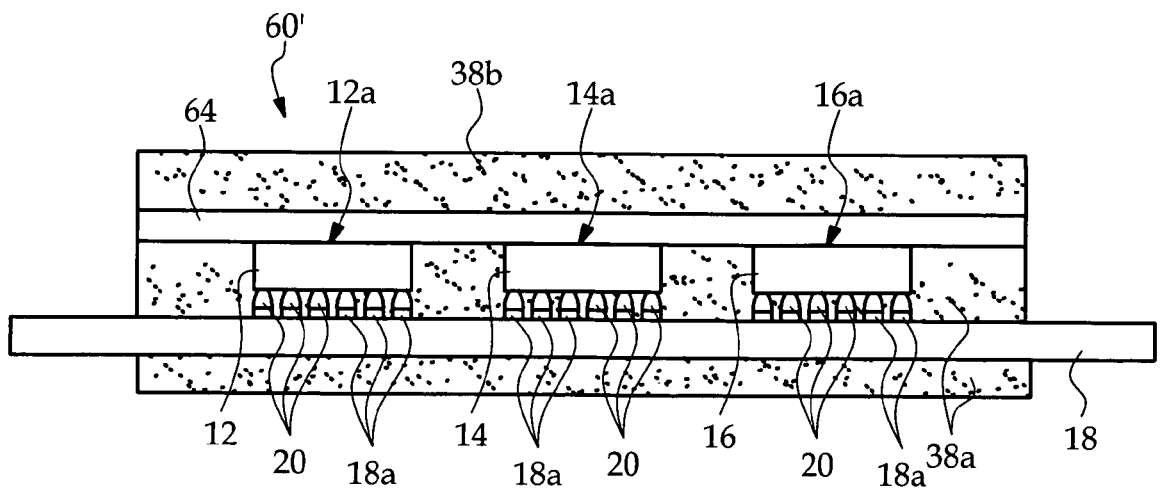

FIGS. 4-6 depict a method of making an encapsulated microelectronic package 60, 60' according to a second embodiment of this invention, where the encapsulant 36 is molded in two pieces 38a, 38b that are joined to form the package, and the coolant channel is defined by a recess in one of the encapsulant pieces 38b. FIG. 4 depicts a partially encapsulated microelectronic package 60 where an encapsulant 38a fills the regions surrounding the chips 12, 14, 16 and substrate 18, leaving the top surfaces 12a 14a, 16a of semiconductor chips 12, 14, 16 uncovered. FIG. 5 depicts a separately formed cover 38b for the package 60. In the illustrated embodiment of FIGS. 4-6, the cover 38b molded with an encapsulant compound, but can be formed in a different way and/or with a different material such as aluminum, for example. In any event, the cover 38b corresponds in overall length and width to that of the encapsulant 38a, and includes has a recess 62 that extends there-across so that when the cover 38b is placed atop the encapsulant 38a, the recess 62 is aligned with the exposed surfaces 12a, 14a, 16a of chips 12, 14, 16 as seen in FIG. 6. The cover 38b is preferably bonded to the encapsulant 38a with a structural adhesive such as epoxy, so that the recess 62 creates a sealed void 64 through the completed package 60'. As a result, fluid coolant flowing through the void 64 comes into direct contact with the semiconductor chip surfaces 12a, 14a, 16a. As with the embodiment of FIGS. 1-3, the coolant may be electrically conductive or electrically non-conductive depending on whether the semiconductor chip surfaces 12a, 14a, 16a are electrically inactive or active. If desired, the encapsulant 38a and top cover 38b may be formed so that the ends of void 64 accommodate inlet and outlet fittings, similar to the embodiment of FIGS. 1-3. Of course, the void 64 can alternately be defined by a recess in the encapsulant 38a, or by recesses in both encapsulant 34a and cover 38b.

In summary, the present invention provides a method of making a fluid cooled encapsulated microelectronic package in which fluid is circulated through the package in fluid-carrying channels defined at least in part by package voids that are defined in part by heat producing components of the package so that coolant fluid directly contacts such components. While described in reference to the illustrated embodiments, it is expected that numerous modifications and variations in addition to those mentioned herein will occur to those skilled in the art. For example, the material compositions may be different than specified herein, and so on. Accordingly, it is intended that the invention not be limited to the disclosed embodiment, but that it have the full scope permitted by the language of the following claims.

The invention claimed is:

1. A method of producing a fluid-cooled microelectronic package, comprising the steps of:

attaching microelectronic components to a substrate to form a microelectronic assembly;

encapsulating at least a portion of the microelectronic assembly by over-molding said portion of said microelectronic assembly with a plastic encapsulant so as to leave a coolant channel free of said encapsulant, said coolant channel being defined by the encapsulant and by surfaces of said microelectronic components;

supplying a coolant to said coolant channel, the coolant thereby coming into direct contact with said surfaces of said microelectronic components;

wherein the step of over-molding said portion of said microelectronic assembly includes the steps of:

positioning a form relative to said microelectronic assembly such that said form is maintained in contact with said surfaces of said microelectronic components;

insert-molding said form with said encapsulant;

removing said form to create said coolant channel; and wherein said form comprises a material having a coefficient of thermal expansion that is greater than that of said encapsulant and said microelectronic components, and the method includes the steps of:

cooling said assembly and encapsulant following the step of insert-molding; and removing said form after said form has contracted due to cooling said assembly and encapsulant; and wherein the material of said form comprises silicone.

2. The method of claim 1, comprising the steps of:

over-molding said portion of said microelectronic assembly with a plastic encapsulant so as to leave one or more surfaces of said microelectronic components free of said plastic encapsulant;

providing a cover for said plastic encapsulant;

bonding said cover to the over-molded plastic encapsulant, said coolant channel being defined by said plastic encapsulant, the surfaces of said microelectronic components, and said cover.

3. The method of claim 2, including the step of:

forming a recess in at least one of said plastic encapsulant and said cover, said coolant channel being defined in part by said recess.

4. The method of claim 2, wherein said cover is formed of molded plastic encapsulant.

5. The method of claim 2, wherein said cover is formed of metal.

* * * * *